United States Patent [19]

Mohsen et al.

[11] Patent Number: 4,881,114
[45] Date of Patent: * Nov. 14, 1989

[54] SELECTIVELY FORMABLE VERTICAL DIODE CIRCUIT ELEMENT

[75] Inventors: Amr M. Mohsen, Saratoga; Esmat Z. Hamdy, Fremont; John L. McCollum, Saratoga, all of Calif.

[73] Assignee: Actel Corporation, Sunnyvale, Calif.

[*] Notice: The portion of the term of this patent subsequent to Apr. 18, 2006 has been disclaimed.

[21] Appl. No.: 864,038

[22] Filed: May 16, 1986

[51] Int. Cl.[4] .................... H01L 29/48; H01L 29/91; H01L 29/04; H01L 27/10
[52] U.S. Cl. ........................................ 357/54; 357/15; 357/13; 357/51; 357/45; 357/59
[58] Field of Search .................... 357/13, 15, 48, 51, 357/54, 45

[56] References Cited

U.S. PATENT DOCUMENTS

| | | | |
|---|---|---|---|
| 2,784,389 | 3/1957 | Kelly | 357/45 |
| 3,423,646 | 1/1969 | Cubert et al. | 357/45 |
| 3,576,549 | 4/1981 | Hess et al. | 357/45 |
| 3,634,929 | 1/1972 | Yoshida et al. | 357/45 |
| 3,742,592 | 7/1973 | Rizzi et al. | 357/45 |
| 4,127,900 | 11/1978 | Raffel et al. | 357/45 |
| 4,257,832 | 3/1981 | Schwabe et al. | 357/45 |
| 4,322,822 | 3/1982 | McPherson | 357/45 |
| 4,399,450 | 8/1983 | Lohstroh | 357/59 |
| 4,445,134 | 4/1984 | Miller | 357/71 |
| 4,455,568 | 6/1984 | Shiota | 357/54 |
| 4,488,262 | 12/1984 | Basire et al. | 357/45 |
| 4,494,135 | 1/1985 | Moussie | 357/45 |
| 4,499,557 | 2/1985 | Holmberg et al. | 357/45 |
| 4,505,026 | 3/1985 | Bohr et al. | 357/54 |
| 4,507,673 | 3/1985 | Aoyama et al. | 357/45 |
| 4,507,756 | 3/1985 | McElroy | 357/45 |
| 4,507,757 | 3/1985 | McElroy | 357/45 |
| 4,543,594 | 9/1985 | Mohsen et al. | 357/51 |
| 4,562,639 | 1/1986 | McElroy | 357/51 |
| 4,589,008 | 5/1986 | Stewart et al. | 357/45 |
| 4,613,886 | 9/1986 | Chwang | 357/59 |
| 4,635,345 | 1/1987 | Hankins et al. | 357/43 |

OTHER PUBLICATIONS

Smith et al., "Laser . . . Circuits", Laser Processing Cent., Nov. 16-17, 1981, Anaheim, Ca.

Primary Examiner—William L. Sikes
Assistant Examiner—Jerome Jackson, Jr.
Attorney, Agent, or Firm—Lyon & Lyon

[57] ABSTRACT

A programmable low impedance interconnect diode element is disclosed having a lower electrode formed of a semiconductor material of a first conductivity type covered by an insulating dielectric layer which may be in a preferred embodiment comprised of an initial layer of silicon dioxide, a second layer of silicon nitride and a third layer of silicon dioxide, covered by a layer of semiconductor material of a second conductivity type.

A programmable read only memory array and a programmable logic array comprising a plurality of the above-described cells are also disclosed.

9 Claims, 6 Drawing Sheets

SELECTIVELY FORMABLE VERTICAL DIODE CIRCUIT ELEMENT

BACKGROUND

1. Field of the Invention

The present invention relates to the field of integrated electronic circuit technology. More particularly, the invention relates to a reliable and manufacturable selectively formable vertical diode circuit element (hereinafter "element"). The element of the present invention may be applied to a Programmable Read Only Memory (PROM) cell in an array with a high packing density, a field programmable logic array, PLA (PLD), and in general to any application requiring a programmable PN junction interconnect element.

2. The Prior Art

It is known to form a connection to an already-manufactured diode element by using one of many known programmable interconnect elements. The prior art does not teach forming a diode junction during the process of forming an interconnect element. Examples of the prior art include U.S. Pat. No. 3,576,549.

In addition, Read Only Memory (ROM) devices have been commonly used to store programs in computer systems. Mask programmed ROMs are the lowest in cost in high volume production, but have the disadvantage of long lead time to manufacturing and an initial high design fee. Programmable ROMs (PROMs) have the advantage of being field programmable by the user. The most-often-used PROMs for high-speed applications are bipolar PROMs which use bipolar fusible link or vertical shorting junction elements. Bipolar PROMs are used in high speed applications but are expensive to manufacture due to their large cell size needed to accommodate the fusible link and its associated selection device in addition to the higher cost of manufacturing using a bipolar technology process.

For instance, because of the nature of the conducting material in the link, relatively high current levels are needed to blow the fusible links during programming. Also, the shape and size of the fusible link must be precise so that the link will function effectively as a conductor if it is not blown and will be a completely open circuit if it is blown. Therefore, very critical photolithographic steps and controlled etch techniques are required during the manufacturing process of fusible link PROMs. Finally, a large gap must be blown in the link in order to prevent it from later becoming closed through the accumulation of the conducting material near the blown gap. Fusible link memory cells are relatively large in order to accommodate the link and, therefore, fusible link PROM devices have high manufacturing and material costs and take up large amounts of chip area.

Other EPROMs use floating gate technology and have a more compact cell size than bipolar PROMs. However, the floating gate EPROM technology has a complicated process flow and depends on data retention in the floating gate which is vulnerable to loss of data by leakage or radiation. In addition floating gate EPROM's are slower than bipolar PROMs because of their high cell resistance, resulting in lower cell reading current.

Various PROM memory cells have been proposed such as: U.S. Pat. Nos. 3,634,929 and 4,499,557, where the anti-fuse is a capacitor and the selection element is an isolated diode, and U.S. Pat. Nos. 4,322,822 and 4,507,757 where the anti-fuse is a capacitor and the selection element is an MOS transistor. In both these disclosures, and all other prior art known to the inventors, the selection device is fabricated prior to programming.

All of the prior art methods known to the inventors as illustrated by the aforementioned patents create a large memory cell and/or require a more complex process because of the need to have both the anti-fuse and the selection element fabricated before programming.

OBJECTS AND ADVANTAGES

It is an object of the present invention to provide a programmable low impedance interconnect diode element that can be made by standard semiconductor fabrication technology.

Another object of the present invention is to provide a programmable interconnect and pn junction diode cell wherein the selection element (pn junction) is underneath the anti-fuse and is created during programming.

It is a further object of the invention to provide a PROM programmable cell using the PLIDE element requiring a small area, when compared to floating gate EPROMs.

Yet a further object of the invention is to provide programmable cell having a high output current.

Advantages associated with the present invention in some or all of its embodiments include a diode interconnect which can be made with standard semiconductor manufacturing techniques, small size, a high reading current after programming, a manufacturing process with a minimal number of steps, and a controlled-radius interconnect filament through the dielectric resulting in a repeatably manufacturable, controlled, low-resistance link after programming. Furthermore, the present invention is characterized by high reliability in both the programmed and unprogrammed state. Other and further advantages of the present invention will appear hereinafter.

SUMMARY OF THE INVENTION

The present invention is directed to a circuit interconnect element which includes a dielectric material sandwiched between two semiconductor materials, one of a first conductivity type and the other of a second conductivity type. The resulting structure has a high impedance before programming but forms simultaneously a PN diode and a low resistance interconnect after programming. One embodiment of the present invention is a read only memory comprised of an array of these elements. The array, in an X-Y matrix, is characterized by small size and hence high packing density.

Applications of the present invention include the formation of an PLIDE element as a cell in either or both of the "AND" or "OR" arrays of a field programmable logic array or other programmable logic device that uses the formation of a PN junction as part of the select circuitry. Further applications include the synthesis of the element within a network of any other circuit elements. Those of ordinary skill in the art will readily discern additional applications for the present invention.

DETAILED DESCRIPTION OF THE PREFERRED EMBODIMENT

The element of the present invention includes a dielectric between semiconductor materials of opposite conductivity type, resulting in a capacitor-like anti-fuse structure which has a high impedance before programming but becomes low resistance link and a PN diode after programming. Co-pending application entitled "Programmable Low Impedance Interconnect Circuit Element", Ser. No. 861,519, filed May 9, 1986, and assigned to the same assignee as the present invention, is expressly incorporated by reference herein.

Figure 1:
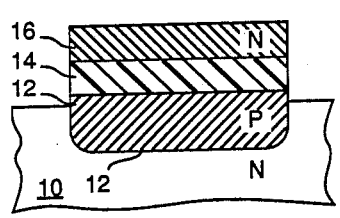
FIG. 1 is a cross-section of a presently preferred embodiment of an element fabricated on a semiconductor substrate material in accordance with the present invention.

Turning in detail to the drawings, FIG. 1 illustrates a cross-section of a presently preferred embodiment of the element of the present invention prior to programming. The structure may be formed on a substrate material 10 which may be a semiconductor material. Those of ordinary skill in the art will readily recognize that substrate 10 may also be formed on any other material known for use as substrate material.

In the embodiment of FIG. 1, a moderately doped semiconductor material of a first conductivity type 12, opposite in conductivity to the substrate 10 forms the bottom electrode. A dielectric layer 14 separates bottom electrode 12 from top electrode 16, which is a heavily doped semiconductor material of a second conductivity type. Also the top electrode 16 could be a sandwich of a metal layer and a heavily doped semiconductor material of a second conductivity type. The metal layer may be comprised of any metal used for interconnect layers in an integrated circuit or used as a diffusion barrier. Although FIG. 1 shows substrate 10 as N-type material, bottom electrode 12 as P-type material and top electrode 16 as N-type material, those of ordinary skill in the art will readily recognize that an embodiment of the present invention may be fabricated using a P-type substrate, an N-type bottom electrode and a P-type top electrode.

In an alternative embodiment using a P-type substrate, an N-type bottom electrode and a top electrode, the top electrode could be a conductor that forms a Schottky diode with the N-type bottom electrode. Those of ordinary skill in the art will readily recognize what conductor materials to use to form a Schottky diode.

Both of the semiconductor materials used to form electrodes 12 and 16 may be made up of a high electromigration immunity material. They may be formed from heavily doped polysilicon, or heavily doped single crystal silicon or a metal or a sandwich of metal and heavily doped polysilicon in the alternative embodiment.

In one preferred embodiment, the dielectric layer 14 between the two electrically conducting materials 12 and 16 may be a composite of three layers. The top layer may be made of an oxide of silicon such as silicon dioxide ($SiO_2$), the center layer may be made of silicon nitride ($Si_3N_4$) and the bottom layer may be made of an oxide of silicon such as silicon dioxide. In this embodiment, the thickness of the top layer may be from zero to approximately 50 A (Angstroms), the thickness of the center layer may be from approximately 40 A to 100 A and the thickness of the bottom layer may be from approximately 20 A to 50 A. The dielectric layer 14 may also be a single silicon nitride layer from approximately 50 A to 250 A thick.

Figure 2:
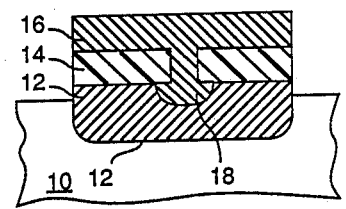
FIG. 2 is a cross-section of the element of FIG. 1 after programming.

FIG. 2 diagrammatically shows a cross section of the PLIDE element after programming. With the application of a voltage source across the two electrodes 12 and 16 at a voltage above the breakdown voltage of the dielectric layer 14, localized dielectric breakdown occurs. Although FIG. 2 shows the top electrode 16 as melted, it is believed that one or both of electrode semiconductor materials melts to form a conductive filament 18 through the dielectric layer. An electrical connection between the top and bottom electrodes 16 and 12 creates a PN junction at the interface. A bipolar NPN transistor between electrodes 16 and 12 and substrate 10 is also created as will be apparent to those skilled in the art. The NPN transistor is the selection transistor for the PROM cell of the present invention.

In an alternative embodiment, substrate 10 is P-type material, bottom electrode 12 is N-type material. Top electrode 16 can form a Schottky diode on bottom electrode 12, after programming the element. An electrical connection between the top and bottom electrodes 16 and 12 creates a Schottky diode.

Figure 3:
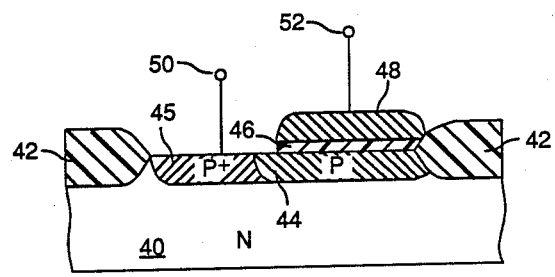
FIG. 3 is a cross-section of an element according to the present invention, integrated into a standard semiconductor process.

FIG. 3 shows a cross section of a element which may be integrated along with other circuitry in a standard MOS integrated circuit fabrication technology. Field oxide regions 42 are thermally grown in N-type substrate or N-well 40 using conventional technology. P-type lower electrode region 44 may be created out of the semiconductor material in substrate 40 using one of the known doping technologies. The doping profile of this P-diffusion is such that both the reverse bias breakdown voltage of the emitter-base junction diode and the collector to emitter punchthrough voltage of the bipolar NPN selection transistors are higher than the programming voltage. The surface doping of the P-diffusion may be in the range of $1 \times 10^{15}$ to $1 \times 10^{17}$ atoms/$cm^3$. For programming voltage less than 30 volts, the doping concentration could be higher. To reduce interconnect resistance, a heavily-doped p++ source/drain diffusion 45 is used as a route to the moderately doped p+ electrode diffusion 44.

Dielectric layer 46 is then formed on top of lower electrode 44 by use of any one of the methods known in the art. N-type upper electrode 48 is then deposited on the upper surfaces of dielectric layer 46 by known techniques and doped to a conductivity opposite that of lower electrode 44. Wordline connection 50 and bitline connection 52 are included in FIG. 3 to indicate how the embodiment there illustrated may be integrated into a PROM array. The layer thickness and doping concentrations and programming considerations used in the present invention are similar to those of co-pending application Ser. No. 861,519, filed May 9, 1986, previously incorporated herein by reference.

The element is programmed by applying a voltage source across the two electrodes 44 and 48. The structures disclosed herein may be programmed by a programming pulse of less than 30 volts and a time duration of less than 100 mSec at a supplied current of less than 10 mA. It is believed that as the applied voltage reaches the dielectric breakdown level during programming, a localized weak spot in the dielectric starts to carry most of the leaking current. Therefore, the weak spot heats up which in turn increases the leaking current at that point. A thermal runaway condition then develops which results in the physical melting of the dielectric and adjacent electrode material. The melted electrode material flows and forms a conductive filament connection to the other electrode material. The final radius of the filament depends on the composition and melting temperature of the dielectric, the electrode conductive material melting temperature and the energy dissipated during programming. By controlling the current, voltage and time of the programming pulse, and by varying the dielectric composition, effective filament radii as small as 0.02 microns can be predictably formed.

Figure 4A:
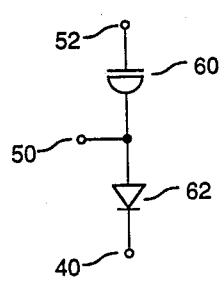
FIGS. 4a and 4b are a schematic diagram of the equivalent circuit of the element before and after programming.
Figure 4B:
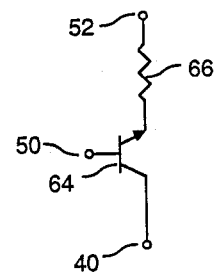

Referring now to FIGS. 4a and 4b, equivalent schematic circuit diagrams for the PLIDE element disclosed in FIG. 3 both before and after programming, respectively, it is seen that when an N-type substrate or well is used, a parasitic PN diode exists between wordline 50 and substrate 40 with its anode at wordline 50, and a capacitance is present between bitline 52 and wordline 50.

After programming, however, a PN junction is formed between wordline 50 and bitline 52 resulting in an equivalent NPN selection transistor formed from the interaction of the element diode and parasitic diffusion-substrate diode, having its base at wordline 50, its collector at substrate 40 and its emitter connected through resistor 66 to bitline 52. Those of ordinary skill in the art will readily appreciate that resistance 66 represents the ohmic resistance of the filament material created during the programming process and the spreading resistance of both electrodes. Those skilled in the art will also note that, since the transistor is formed during programming, it is an integral part of the anti-fuse element and thus takes up a small chip area.

Those of ordinary skill in the art will readily appreciate that if the conductivity types of all the semiconductor materials in FIG. 3 were reversed, the parasitic diode 62 would have its anode at its substrate and its cathode at wordline 50 and that the transistor 64 of FIG. 4b would be a PNP transistor.

Figure 5A:
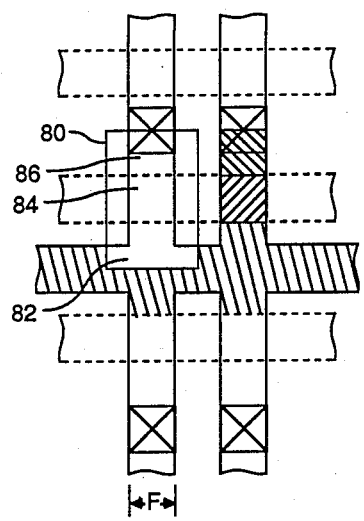
FIGS. 5a and 5b are layouts of a prior art EPROM memory cell and a memory cell comprising an element, respectively.
Figure 5B:
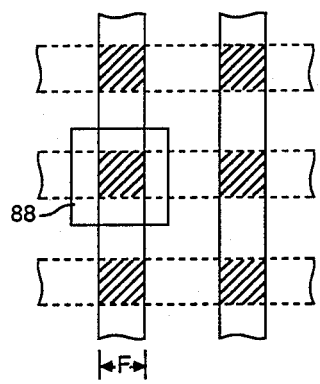

With reference to FIGS. 5a and 5b, the savings in chip real estate available by use of the present invention will be readily apparent. FIG. 5a illustrates a top view layout of a typical MOS EPROM cell. As FIG. 5a illustrates, the area needed for a single MOS EPROM cell 80 includes area for a source 82, a gate 84 and a drain 86. The assumption used in FIG. 5a is a technology with zero bird's beak and borderless contacts for both cells although the comparison would still be valid if bird's beak and borders were assumed. Assuming a feature size F, which depends only on the lithography used, and further assuming isolation between memory cells of F, the size of an EPROM memory cell is $6F^2$. Those skilled in the art will realize that this estimate is somewhat generous, since the width and the length of the MOS transistor will actually be effected by considerations such as voltage punch-through and will thus likely need to be larger than the feature size F.

Turning now to FIG. 5b, the reduction in effective area of the PROM memory cell using the present invention is readily apparent. In fact, the entire memory cell 88 of the present invention can be fabricated in an area equal to the size of only the gate region of the prior art memory cell of FIG. 5a. Because of the vertical stacking of the anti-fuse and the selection element the total area needed for the memory cell of the present invention, including the spacing necessary to separate adjacent cells is only $4F^2$, assuming a feature size F and cell isolation of F. Thus, utilization of memory cells of the present invention enables the user to achieve greater packing densities than is possible to achieve using MOS EPROM technology.

Figure 6:
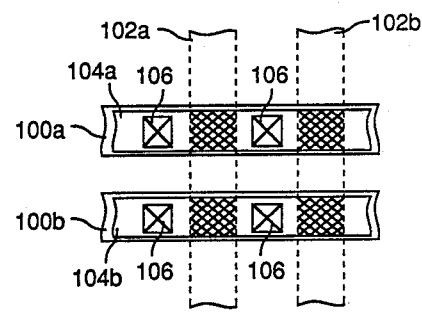
FIG. 6 is a layout of a memory cell using single layer metal.

Turning now to FIG. 6, a layout of an array of memory cells will be disclosed. In FIG. 6 wordlines 100a and 100b are formed by diffusion of dopant into a substrate (not shown) and are shown as horizontal strips. Bitlines 102a and 102b are shown in dashed lines as vertical strips, and may be formed of polysilicon as is known in the art. Wordlines 100a and 100b are separated from bitlines 102a and 102b, respectively, by the dielectric material disclosed herein. Metal lines 104a and 104b are run over wordlines 100a and 100b respectively, and are separated from the underlying bitlines 102a and 102b by an appropriate insulating material such as silicon dioxide. Contacts 106 are made between wordlines 100a and metal lines 104a and wordline 100b and metal line 104b. As will be readily understood by those skilled in the art, the use of metal lines 104a and 104b are used to lower the resistance along the length of the wordlines and thus improve the speed characteristics of the memory array. The PLIDE ROM cells of the present invention are shown as the cross-hatched areas in FIG. 6.

Figure 7:
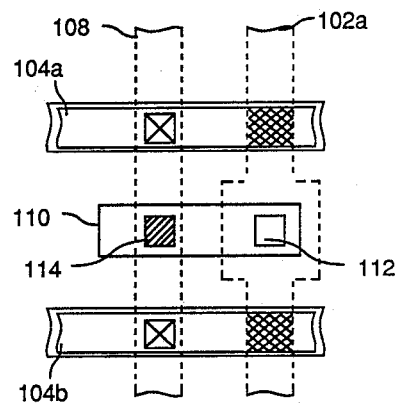
FIG. 7 is a layout of a memory cell using double layer metal.

Turning now to FIG. 7, a layout of an array of memory cells using double metal technology is disclosed. Those of ordinary skill in the art will recognize that FIG. 7 differs from FIG. 6 by the addition of a second metal line, shown at 108 running vertically at 108, and an extra portion of metal in the first metal layer between metal line 104a and 104b, shown at 110. By use of contacts 112 and vias 114, the bitlines (represented by dashed line 102a in FIG. 7) may be periodically stitched to the metal layer in order to reduce the resistance of the bitlines and thus enable faster optimum speed. The ROM cells are indicated by cross-hatched areas of FIG. 7.

Figure 8A:
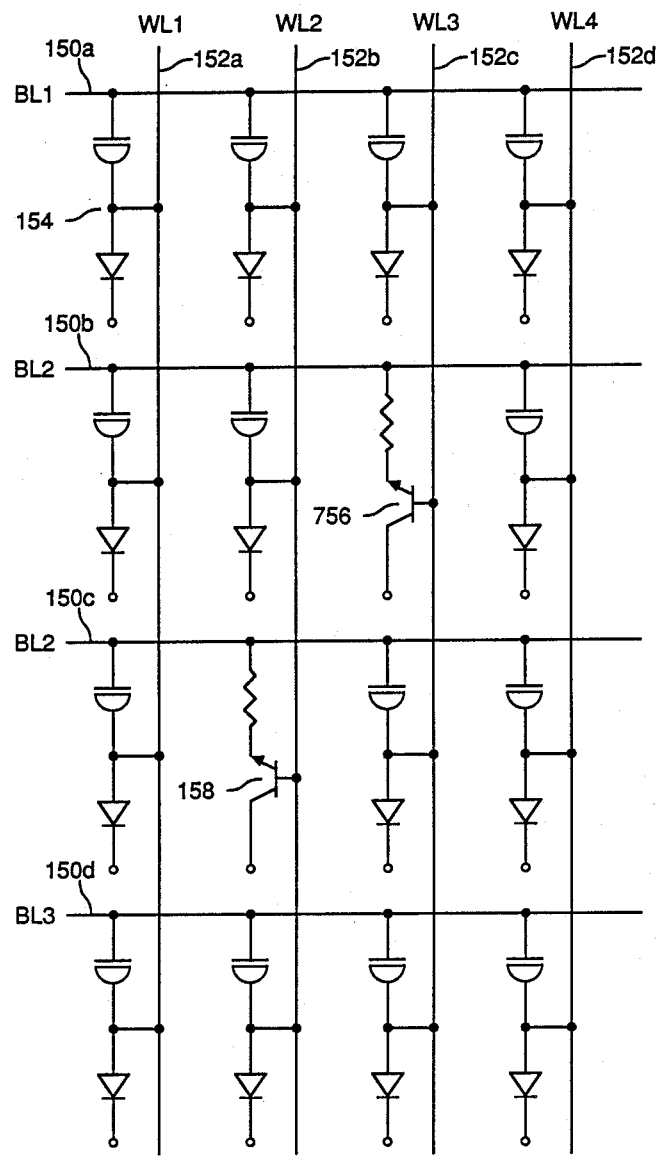
FIGS. 8a and 8b are schematic diagrams of a memory array comprised of memory cells and a programmable logic array comprised of memory cells respectively.

FIG. 8a is an equivalent schematic diagram of an memory array built according to the present invention. Although FIG. 8 illustrates a 4×4 memory array, those of ordinary skill in the art will readily recognize how to make any size array. Bitlines BL1–BL4, 150a, 150b, 150c, 150d respectively, and wordlines WL1–WL4, 152a, 152b, 152c, 152d respectively, form the matrix of the array. The equivalent circuits of FIG. 8 are drawn in the manner used in FIG. 3. That is, the element before programming is shown as an equivalent capacitor from a bitline to a wordline and parasitic diode from a wordline to the substrate, and after programming is shown as an NPN transistor having its base at a wordline, its collector at the substrate and its emitter connected through the filament on-resistance to a bitline. For example, the cell existing at the intersection of BL1, 150a and WL1, 152a shown at reference numeral 154, is unprogrammed. The memory cells at the intersection of BL2 and WL3 (150b and 152c) and BL3 and WL2 (150c and 152b) are shown programmed at reference numerals 156 and 158 respectively. Those of ordinary skill in the art will readily recognize from the disclosure herein that an opposite polarity array using PNP transistors can be fabricated.

Figure 8B:
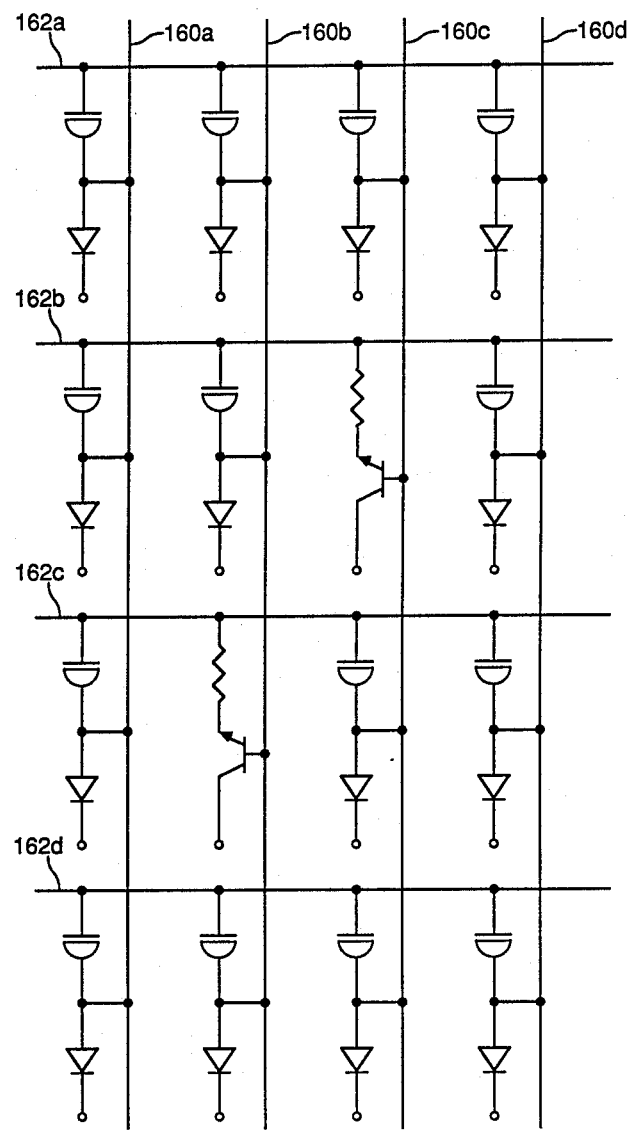

Similarly, elements of the present invention may be used to configure a programmable logic array as is illustrated with respect to FIG. 8b. Although FIG. 8b illustrates 4 inputs and 4 min-terms, those of ordinary skill in the art will readily appreciate how embodiments comprising other numbers of inputs and other numbers of min-terms could be configured from this disclosure.

The four inputs to the programmable logic array of this embodiment to the invention are illustrated as 160a, 160b, 160c and 160d respectively. Similarly, four min-terms are shown as 162a, 162b, 162c and 162d respectively. Those of ordinary skill in the art will readily appreciate that an orgate can be configured by programming any one or more of the devices connecting inputs 160a through 160d to any one of the min-terms 162a through 162d. Those of ordinary skill in the art will readily recognize that if all of the input terms were inverted and the min-terms were inverted that an AND gate would be created.

The various embodiments of the element disclosed herein take up a smaller amount of chip real estate as compared with prior art programmable interconnects and therefore provide for high density construction in electronic circuitry. The elements disclosed herein also allow for low programming currents and voltages and thus are compatible with high speed CMOS technology and circuits of VLSI densities. When the elements are programmed the filament of the interconnect element has a low impedance, usually in the order of less than 300 ohms, and allows a high diode read current, on the order of 0.5 mA, thus enabling high speed circuit elements to be configured. Furthermore, elements have a very high reliability in both the programmed and unprogrammed states which makes them useful for VLSI applications. Finally, elements give very high manufacturing yields and can be made with standard circuit manufacturing processes.

As illustrated in FIGS. 9a-9e, the preferred embodiments of the present invention are easily incorporated into standard silicon integrated circuit manufacturing processes.

Figure 9A:
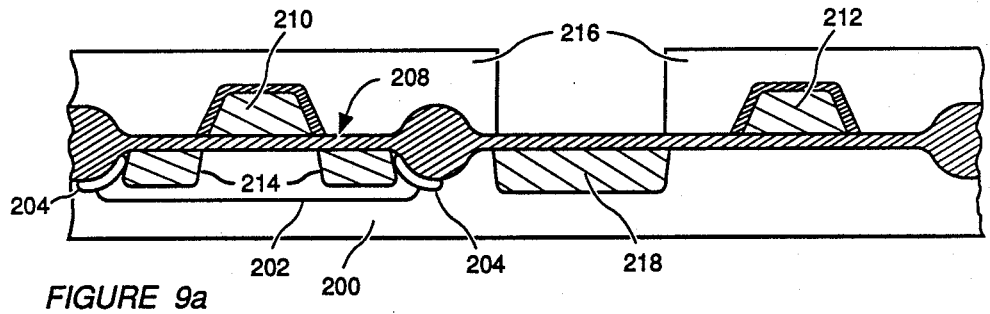
FIGS. 9a–9e are semiconductor cross-sections illustrating a process for incorporating an element into a standard CMOS process.

First, as shown in FIG. 9a, the silicon wafers have been processed utilizing a standard CMOS silicon gate process to the point where the element is to be incorporated in an appropriate area on the substrate. Specifically, substrate 200 has been implanted with boron to form P-well 202 and field implants 204. Field oxide regions 206 and first oxide 208 have been grown using conventional processing steps. Polysilicon gate 210 has been formed for an N-channel device and polysilicon gate 212 for a P-channel device. Arsenic source/drain regions 214 have been diffused into P-well 202 and a layer of photoresist 216 has been applied to the wafer as a mask to define the region 218.

Region 218 is first doped with a medium dose of boron, in the appropriate level for a bipolar transistor base with an emitter base junction breakdown and a collector to emitter punchthrough voltage larger than the programming voltage. Next the initial oxide 208 has been dipped back from the region using photoresist 216.

Figure 9B:
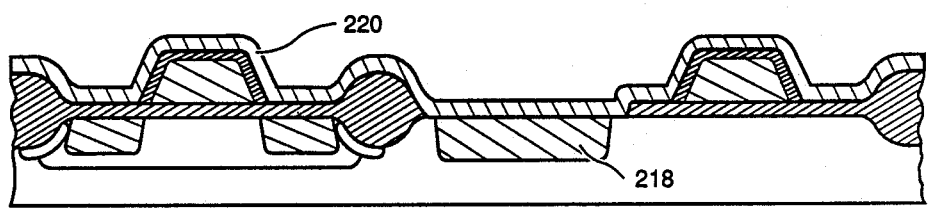

Referring now to FIG. 9b, the composite dielectric layer 220 is next formed across the whole wafer. In a preferred embodiment, a first layer of silicon dioxide is either deposited or thermally grown. A silicon nitride layer is next deposited using standard LPCVD or CVD techniques. A final layer of silicon dioxide is then either deposited or thermally grown.

Figure 9C:
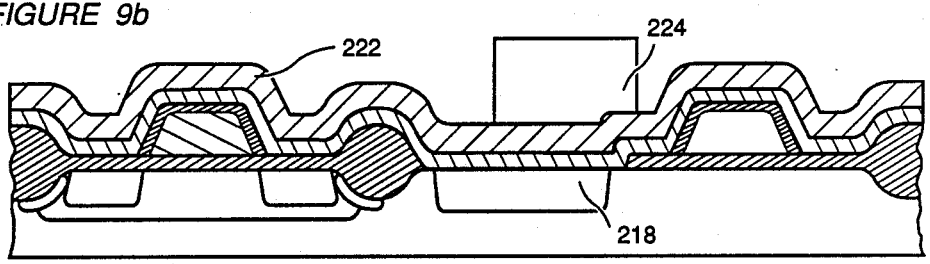

As shown in FIG. 9c, polycrystalline silicon layer 222 is then formed and doped to comprise to the top electrically conducting material. Region 222 may be fabricated with standard LPCVD or CVD techniques. A photomask 224 and etching process is next used to delineate the polycrystalline silicon region which will serve as the upper electrically conducting material.

Figure 9D:
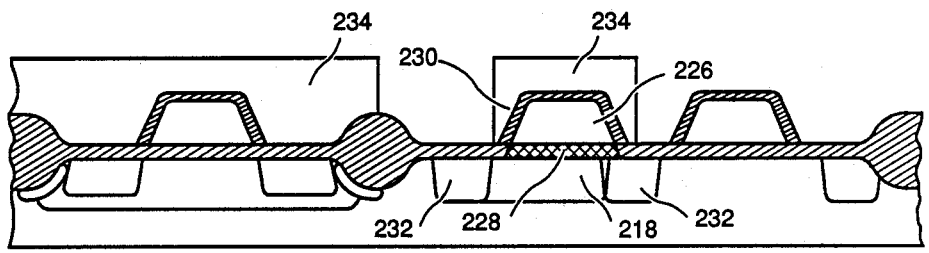

As shown in FIG. 9d, the polycrystalline silicon region 226 has been used as a mask to selectively remove the silicon dioxide/silicon nitride/silicon dioxide dielectric sandwich except in region 228 where it serves as the dielectric for the element. Hence the structure is left only where the polysilicon was photomasked. The structure is then sealed with a thin thermal oxide layer 230.

Figure 9E:
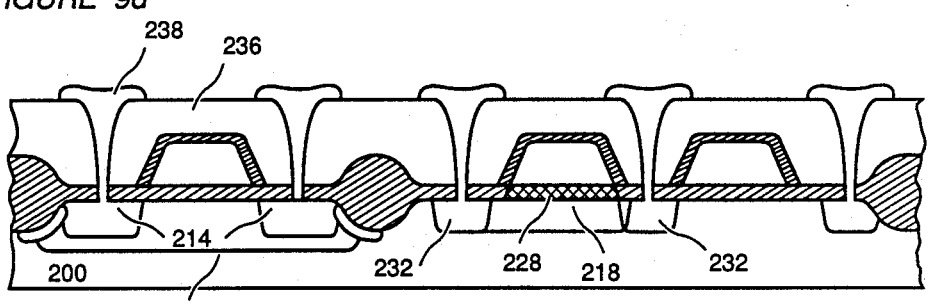

The boron source/drain regions 232 for P-channel devices are implanted, using mask 234. As shown, this heavy boron doping also serves as a route to the more moderately designed boron element region. The process of manufacturing the circuit can then continue in a standard manner to form the finished device as shown in FIG. 9e. A polysilicon glass passivation layer 236 is deposited, flowed and contact cuts are made. Metal 238 is then deposited and delineated making connections to the transistors and element nodes. If dual layer metal is to be used, an interlayer dielectric is deposited and via cuts are made, then a second layer of metal is deposited, delineated and annealed. Finally, the dielectric is deposited for scratch protection and the metal pads are opened.

Figure 10A:
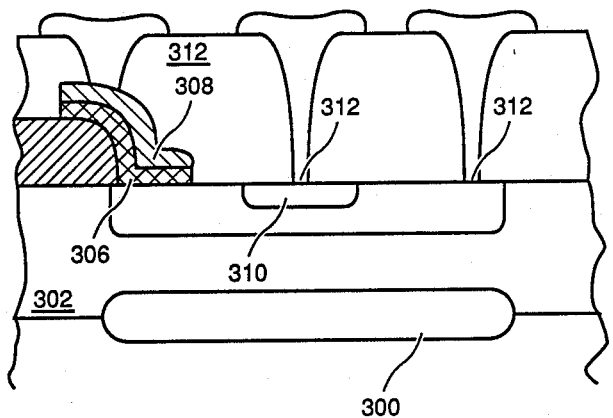
FIGS. 10a and 10b illustrate two preferred embodiments of the element fabricated in a bipolar process.
Figure 10B:
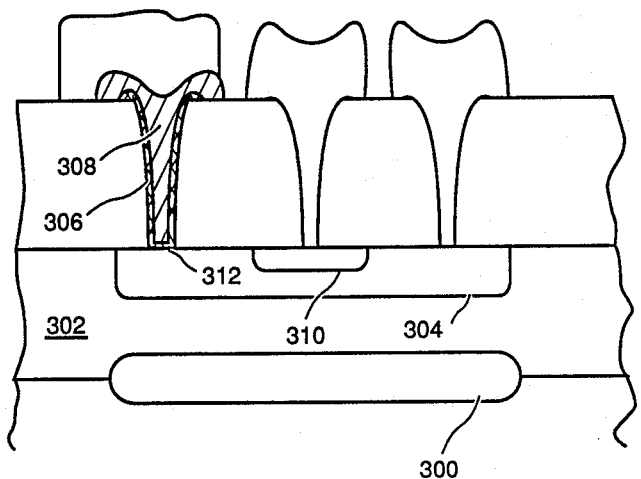

Referring now to FIGS. 10a and 10b, the PLIDE element can also be applied to bipolar PROM devices to achieve equivalent speeds, but yielding a much smaller cell and hence higher yields and lower costs. The preferred embodiment would be the same as for the CMOS as that structure yields a bipolar device, which is identical to that commonly used in bipolar PROMs. The advantage over current bipolar PROMs is realized due to the fact that the structure is vertical, directly over the emitter. Whereas conventional cells utilize a lateral fuse structure, which consumes additional area. The process would begin as a conventional bipolar process, first the buried layer 300 would be defined and diffused in, followed by the epitaxial deposition 302 and isolation process (not shown), of which there are several methods, all of which will work with the element. The base diffusion 304 would then be defined and predeposited. There are two preferred placements for the element. In the first case, shown in FIG. 10a, the element would be formed prior to the base drive in diffusion and oxidation. After the formation of the dielectric 306, deposition, doping and definition of polysilicon layer 308 which would also strip the dielectric from the unwanted areas, the base 304 which was predeposited could then be diffused and oxidized. The emitter 310 would then be defined and diffused followed by the contact cuts 312. The back end of the process would then continue as known in the art.

Alternatively, a second embodiment is shown in FIG. 10b wherein the element could be constructed in a selected contact opening 312 over base 304. Following the definition of the PLIDE element dielectric 306 and polysilicon 308, the metalization process would proceed as known in the art. Either single or dual metal processes may be used.

While embodiments and applications of this invention have been shown and described, it would be apparent to those skilled in the art that many more modifications are possible without departing from the inventive concepts herein. The invention, therefore, is not to be restricted except in the spirit of the appended claims.

What is claimed is:

1. A selectively formable vertical diode circuit element formed by a process including the steps of:
   forming a diffusion area of a first conductivity type in a semiconductor substrate of a second conductivity type,
   forming a first oxide insulating layer over said diffusion area,
   forming a second silicon nitride insulating layer over said first insulating layer,
   forming a third oxide insulating layer over said second insulating layer,
   forming a semiconductor layer of second conductivity type over said insulating layer above at least a portion of said diffusion area,
   and further a step of applying a voltage source for a controlled time between selected ones of a said diffusion areas and said semiconductor layer, at a voltage sufficient to break down said first, second, and third insulating layers and form a diode.

2. A plurality of selectively formable vertical diode circuit elements disposed in a semiconductor substrate of a first conductivity type, each of said elements including:
   a first electrode comprising a first region of semiconductor material of a second conductivity type disposed in said substrate,
   an insulator covering said first region, said insulator having a first layer of silicon dioxide, a second layer of silicon nitride over said first layer of silicon dioxide, and a third layer of silicon dioxide over said layer of silicon nitride, and,
   an upper layer of semiconductor material of said first conductivity type over said insulator,
   at least one of said elements further including a conductive filament in said insulator, said filament extending between and forming a PN junction between said first and second regions of semiconductor material.

3. The plurality of selectively formable vertical diode circuit elements of claim 2, wherein said first region is moderately doped and said second region is heavily doped.

4. The plurality of selectively formable vertical diode circuit elements of claim 2, wherein said first layer in said insulator has a thickness in the range of from approximately 20 Å to 50 Å, second layer in said insulator has a thickness of from approximately 40 Å to 100 Å, and the third layer in said insulator has a thickness of from approximately 0 Å to 50 Å.

5. The plurality of selectively formable vertical diode circuit elements of claim 4 wherein substrate is N-type material, said first region is P-type material and said upper layer is N-type material.

6. The plurality of selectively formable vertical diode circuit elements of claim 5 wherein said first region is surfaced doped to the range $1 \times 10^{15}$ to $1 \times 10^{17}$ atoms/cm$^3$.

7. The plurality of selectively formable vertical diode circuit elements of claim 2 wherein said upper layer is heavily doped polysilicon.

8. The plurality of selectively formable vertical diode circuit elements of claim 5 wherein said upper layer is heavily doped polysilicon.

9. A plurality of selectively formable vertical diode circuit elements disposed in a semiconductor substrate of a first conductivity type, each of said elements including:
   a first electrode comprising a first region of semiconductor material of a second conductivity type disposed in said substrate,
   an insulator covering said first region, said insulator having a first layer of silicon dioxide, a second layer of silicon nitride over said first layer of silicon dioxide, and a third layer of silicon dioxide over said layer of silicon nitride, and, an upper layer of metal over said insulator, at least one of said elements further including a conductive filament in said insulator and forming a Schottky diode contact between said metal and said first region.

* * * * *